United States Patent [19]
Mullin et al.

[11] Patent Number: 5,612,629
[45] Date of Patent: Mar. 18, 1997

[54] SYSTEM AND METHOD FOR DETECTING FAULT CONDITIONS IN A DIRECT CURRENT MOTOR

[75] Inventors: Eugene T. Mullin, Phoenixville; Clifford J. Bader, West Chester, both of Pa.

[73] Assignee: Lockheed Martin Tactical Systems, Inc., New York, N.Y.

[21] Appl. No.: 476,902

[22] Filed: Jun. 7, 1995

Related U.S. Application Data

[62] Division of Ser. No. 851,652, Mar. 16, 1992.

[51] Int. Cl.⁶ ..................................................... G05B 19/40
[52] U.S. Cl. ........................... 324/772; 318/490; 340/648
[58] Field of Search ........................... 324/545, 772, 324/546, 547, 500, 537; 318/668, 490, 434, 254, 696; 340/648; 322/99

[56] References Cited

U.S. PATENT DOCUMENTS

| | | | |
|---|---|---|---|
| 2,568,406 | 9/1951 | Packer et al. .......................... | 324/545 |
| 4,422,040 | 12/1983 | Raider et al. .......................... | 318/490 |
| 4,574,225 | 3/1986 | Pershall et al. ........................ | 318/696 |

*Primary Examiner*—Vinh P. Nguyen
*Attorney, Agent, or Firm*—Stanton D. Weinstein; Glenn W. Bowen; Allan Ratner

[57] ABSTRACT

Apparatus and method are provided for determining indicating if certain types of circuit failures have occurred in a D.C. motor circuit such as a locked rotor condition, a short-circuit or an open circuit. The method includes the steps of, and the apparatus involves, applying a voltage to two leads of the D.C. motor sufficient to cause motor rotation, determining if flyback exists, determining if back EMF exists, and, finally, if a back EMF does not exist and flyback does exist then indicating a locked rotor condition. However, if a back EMF does not exist and flyback does not exist then an indication is provided that either an open-circuit or short-circuit condition exists. The same apparatus and method can be used with a voltage not sufficient to cause motor rotation, although given this limitation only flyback can be detected, so that only an open-circuit or short-circuit condition can be indicated.

56 Claims, 10 Drawing Sheets

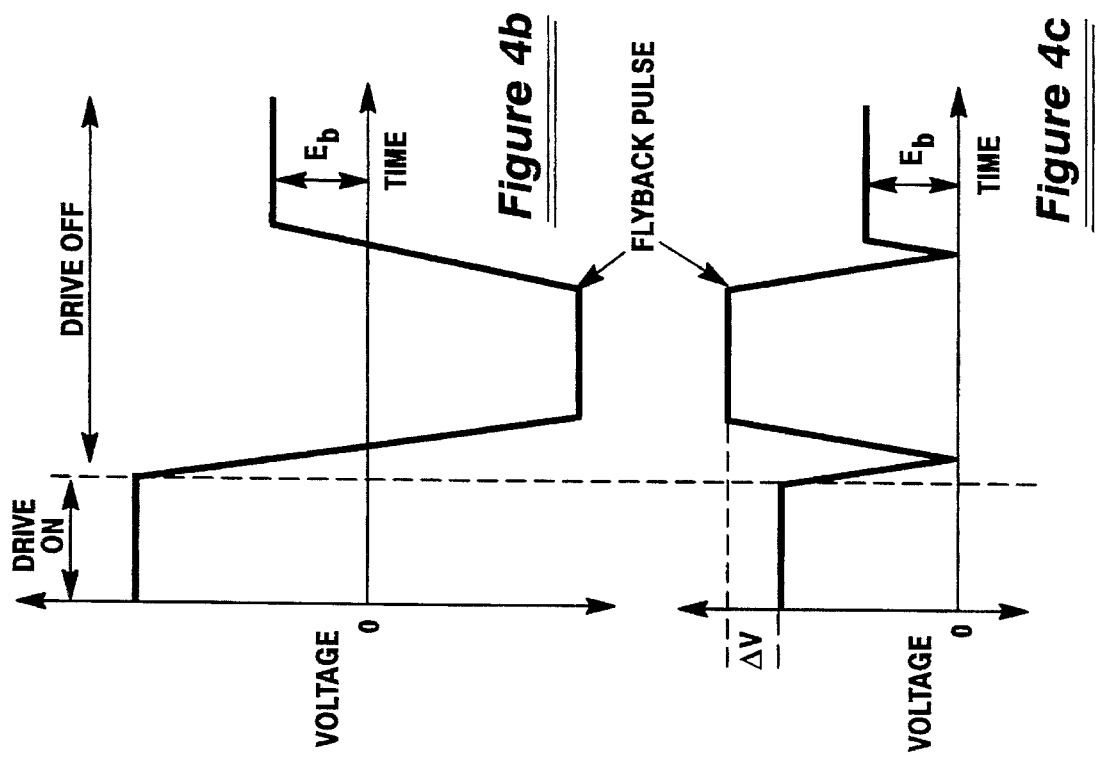
*Figure 4b*
*Figure 4c*
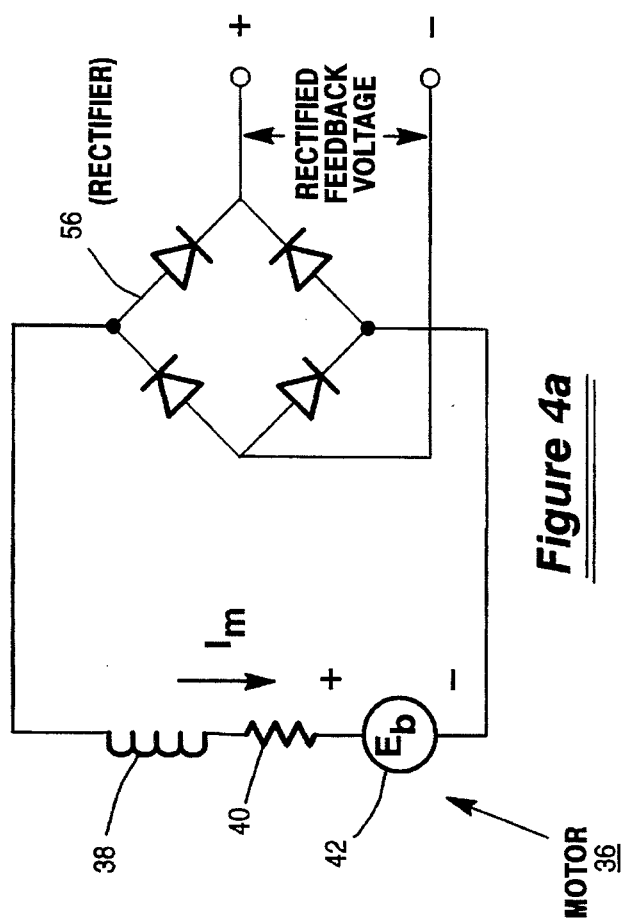
*Figure 4a*

SYSTEM AND METHOD FOR DETECTING FAULT CONDITIONS IN A DIRECT CURRENT MOTOR

This application is a division of U.S. Pat. application Ser. No. 07/851,652 filed Mar. 16, 1992, pending.

FIELD OF THE INVENTION

The present invention relates generally to the detection of D.C. motor circuit failures and, more particularly, to detecting D.C. motor circuit failures using only the terminal voltage.

BACKGROUND OF THE INVENTION

The equivalent circuit of a D.C. motor comprises a generator representing the back EMF, a resistance representing the armature and brush resistance, and an inductor representing the armature inductance. It is well known that a rotating motor acts like a generator due to the internal voltage it produces known as back EMF. However, when the motor is not rotating, the back EMF is zero and only the resistance and inductance remain.

In systems which use moving D.C. motors whose leads are connected to sliding collectors or contacts which ride in voltage supply rails, many additional challenges are presented to a failure detection technique for D.C motors which are not pertinent to stationary motors. It should be noted that in a system which uses moving D.C. motors, at any given point in time, each motor in the system is connected to a unique drive or supply system. The voltage supply rails are segmented with insulators inserted between sections of copper. Each copper segment of the rails is connected to individual stationary control means. In such a system, the motors are moved from segment to segment being energized when the application dictates it necessary.

In such a system, the resistance of each motor supply path is often larger than that of the motor. This fact makes it difficult to detect a short in either the motor, the motor leads, or the sliding collectors. However, the ferromagnetic structure of the motor makes its inductance the largest reactive element in the system, so that the presence of sufficient inductance offers a reliable method for verifying system integrity.

In order for a fault detection system to offer positive protection against potentially dangerous or damaging conditions, it should operate in real time and should function whether or not a given motor is being driven. In addition, when considering the aforementioned system, wherein D.C. motors are not stationary, the available methods of inductance sensing which can be employed are more restricted than they would be for a stationary or off-line measuring technique.

Since, as mentioned, the inductance of a motor is the largest reactive element in a motor circuit path, techniques which measure inductance can be employed in a fault detection system. A common method of measuring inductance is the use of an impedance bridge. It is very difficult to conduct bridge-type frequency domain inductance measurements for on-line, real-time applications.

The technique described herein, employs time-domain measurements which are easier to achieve and especially compatible with the commonly used pulse-width modulation (PWM) control systems for D.C. motors.

It should be noted that the system and method presented in this disclosure provide an accurate and reliable means for detecting failures in a D.C. motor circuit. It is not limited to, in any way, the aforementioned system where the motors are not stationary, this system and method can be applied to both stationary and non-stationary motors in many applications.

SUMMARY OF THE INVENTION

A system and method for determining and indicating if certain types of circuit failures have occurred in a D.C. motor circuit such as a locked rotor condition, a short-circuit or an open circuit.

One aspect of the present invention comprises the steps of applying a voltage to a D.C. motor great enough to cause motor rotation, determining if flyback exists, determining if a back EMF exists, and, finally, if back EMF does not exist and flyback does exist then indicating a locked rotor condition.

Another aspect of the present invention comprises the steps of applying a voltage to a D.C. motor great enough to cause motor rotation, determining if flyback exists, determining if a back EMF exists, and, finally, if back EMF does not exist and flyback does not exist then indicating an open-circuit or short circuit condition.

Another aspect of the present invention comprises the steps of applying a voltage to a D.C. motor not great enough to cause motor rotation, determining if flyback exists in order to verify the integrity of the motor circuit path (if flyback does not exist then indicating an open-circuit or short-circuit condition).

BRIEF DESCRIPTION OF THE DRAWINGS

The invention is best understood from the following detailed description when read in connection with the accompanying drawings, in which:

FIG. 4a shows a rectifier coupled to the motor leads of FIGS. 1 and 2.

FIG. 4b shows a waveform created by the motor in FIG. 1 including the termination of an applied voltage, a flyback voltage transient, and back EMF.

FIG. 4c shows the waveform of FIG. 4b after passing through the rectifier of FIG. 4a.

FIG. 5b shows more details of the comparator circuit shown in FIG. 5a.

DETAILED DESCRIPTION OF THE INVENTION

The present invention involves the use of the internally generated motor voltage (back EMF) and the voltage induced during the turn off of a motor (flyback) for diagnostic purposes (i.e., detecting if the motor has a locked rotor, or if an open-circuit or short-circuit condition exists). Access to the back EMF and flyback voltages is through the same leads which provide the drive voltage to the motor.

Bidirectional PWM Driven D.C. Motor Circuit

Figure 1:
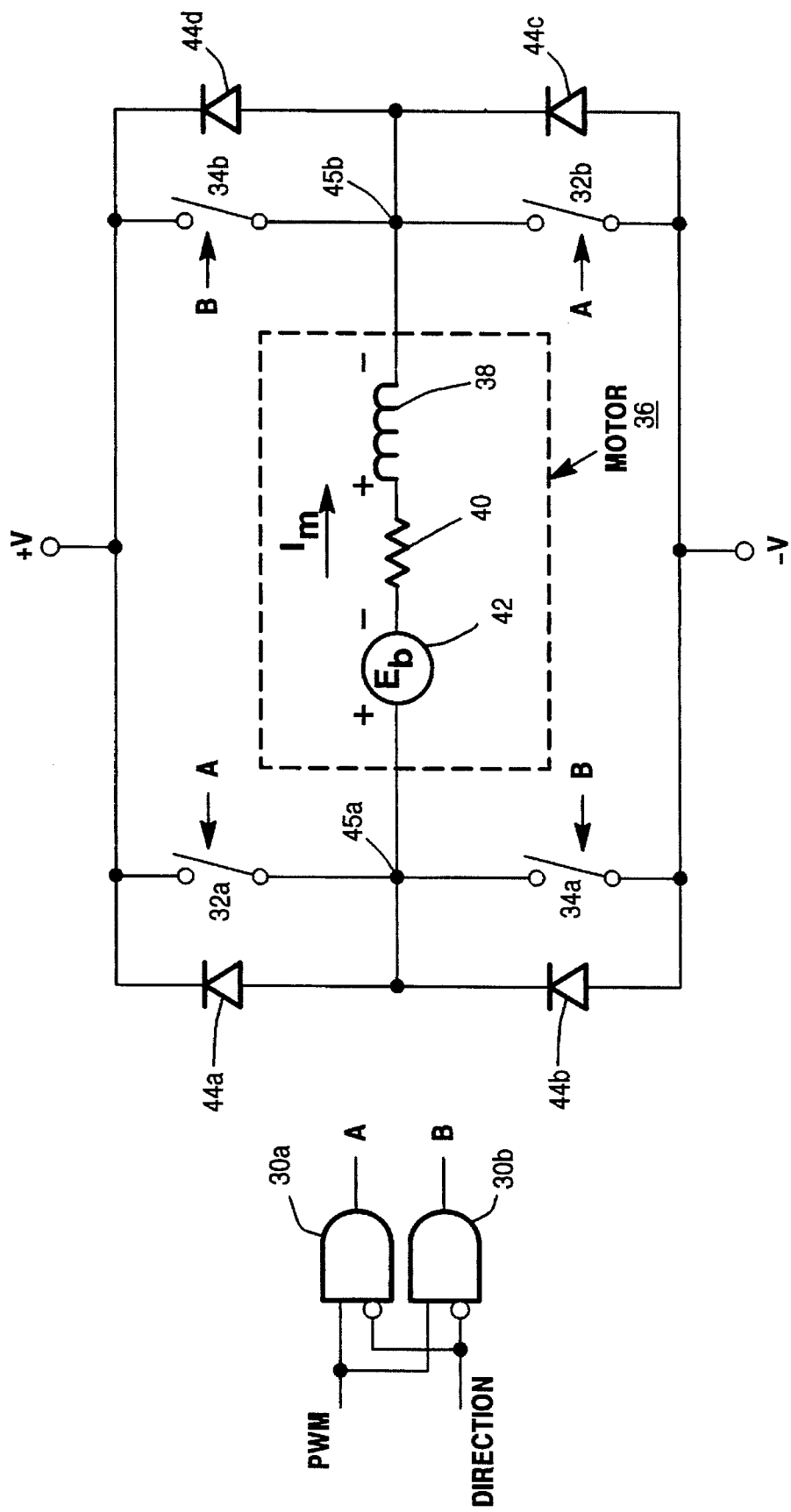
FIG. 1 shows a typical bidirectional D.C. motor driver circuit with PWM control.

FIG. 1 shows a typical bidirectional D.C. motor driver circuit employing pulse-width modulated (PWM) control. The PWM control signal and a DIRECTION signal are gated through AND gates 30a and 30b. The DIRECTION signal is negated before being fed into AND gate 30a. The outputs of this circuitry are the signals A and B which control switches 32a, 32b, 34a and 34b. Signal A controls switches 32a and 32b while signal B controls switches 34a and 34b. In the exemplary embodiment of the present invention, each switch is a transistor. These transistors operate in pairs to achieve the desired direction of motor rotation. In addition, each transistor is operated in the switching mode (i.e., they are either non-conducting or in saturation with a very low terminal voltage).

A motor 36, represented by its circuit equivalent (a series combination of an inductor 38, a resistor 40 and a back EMF source (Eb) 42) is coupled between the switches for proper direction control, via terminals 45a and 45b.

Also shown in FIG. 1 are the positive and negative voltage supplies, +V and −V. The circuit also includes clamping diodes 44a, 44b, 44c and 44d, those skilled in the art understand the importance of limiting the amplitude of the inductive flyback voltage of a driven D.C. motor whether with clamping diodes or other means.

In operation, when signal A is asserted, switches 32a and 32b are on (or closed) and switches 34a and 34b are off (or open). This means the +V is connected to terminal 45a of motor 36 and −V is connected to terminal 45b of motor 36. In this configuration, the motor current, Im, is flowing through the motor 36 from terminal 45a to terminal 45b.

It should be noted that control of the PWM drive signal produces an average D.C. voltage proportional to the ratio of conduction time to the period of the PWM cycle. During this conduction time, the motor current, Im, increases at an initial rate $di/dt = (E - Eb)/L$, where E is the supply voltage (semiconductor drops neglected), Eb is the back EMF, and L is the inductance of inductor 38.

When signal A is unasserted, switches 32a and 32b are turned off. However, because of the energy stored in the magnetic field of the motor windings, the motor current, Im, cannot change instantaneously. Using the drive scheme shown in FIG. 1, this energy produces a terminal voltage (across terminals 45a and 45b) of reverse polarity (flyback) which keeps current flowing in the path through the clamp diodes 44b and 44d as shown in FIG. 2.

Figure 2:
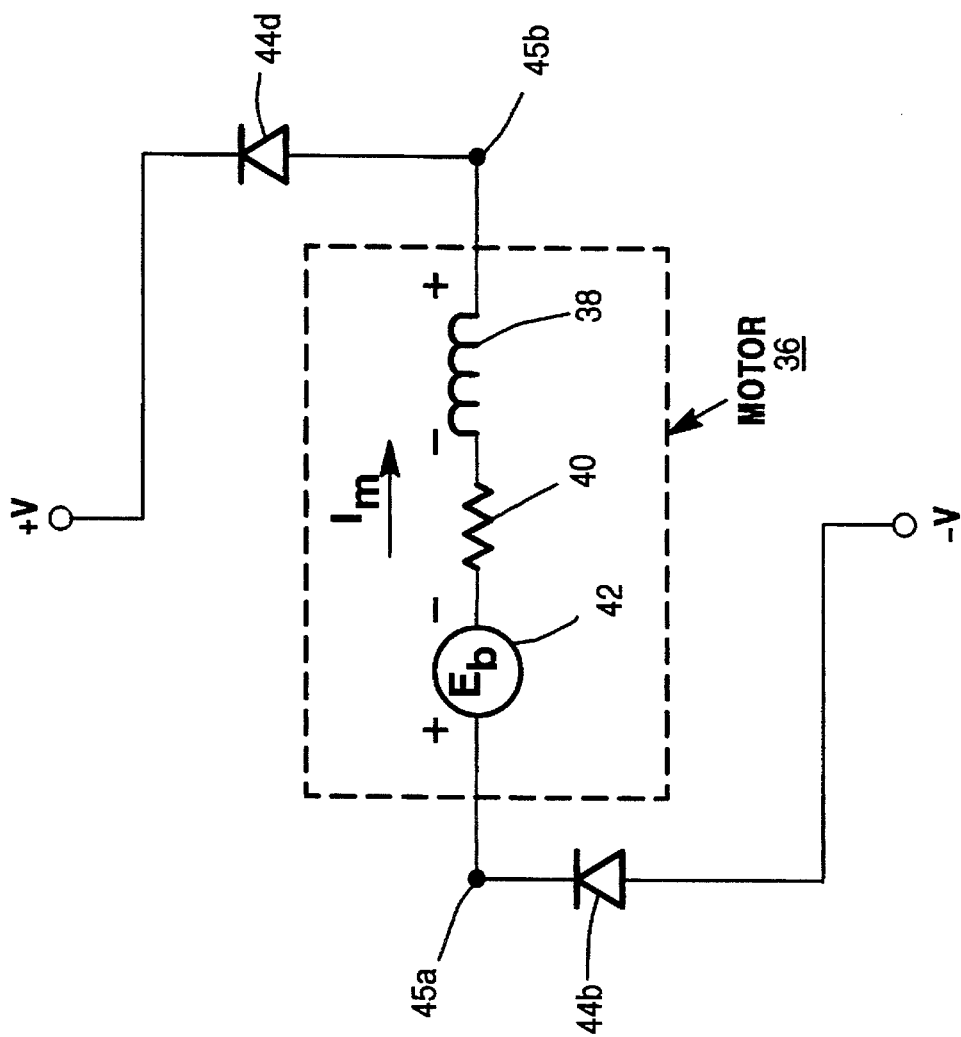
FIG. 2 shows the active components of the circuit in FIG. 1 immediately following the termination of an applied motor voltage.

Effectively, the only conducting circuit components are those shown in FIG. 2. The +V supply is connected to terminal 45b of motor 36 via clamping diode 44d and the −V supply is connected to terminal 45a of motor 36 via clamping diode 44b. It should be noted that the inductance of the motor 36 has forced the terminal voltage to reverse polarity in order to maintain the current flow (note the polarity of the terminal voltage has reversed from the conditions described in FIG. 1 (driven state) to the conditions described in FIG. 2 (immediately following termination of drive)).

In this configuration, the motor current, Im, initially decreases at a rate $di/dt = (E + Eb)/L$, because the back EMF and the supply voltage are now additive. It is significant that in the absence of the motor inductance, there is no flyback voltage after switches 32a and 32b are turned off.

Thus, the presence of reverse voltage across the terminals 45a, 45b (flyback) immediately following the termination of applied voltage can therefore be the basis for verifying the continuity of a complete circuit path through the motor 36 and the absence of other fault conditions such as an open-circuit or a short-circuit.

Method For Determining Types of Circuit Failures

Figure 3:
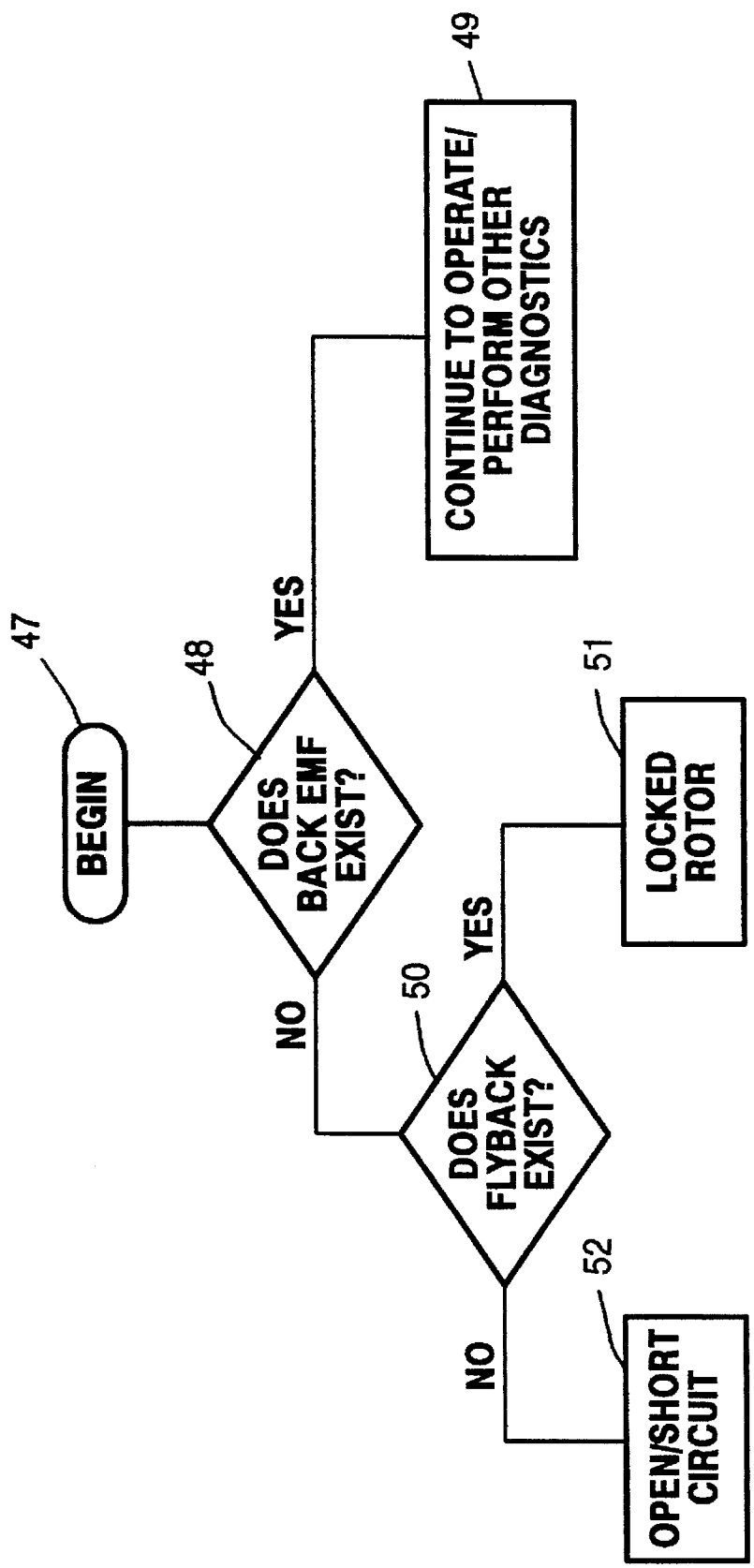
FIG. 3 shows a high-level flowchart of the method used for qualifying the problem conditions in a motor system.

FIG. 3 shows a high-level flowchart illustrating a method incorporating an embodiment of the present invention for determining what condition exists in the system. The method begins at block Decisional block 48 determines whether or not there is back EMF. If the motor 36 is generating back EMF, the execution of this method continues at block 49 which instructs the system to continue operating and/or conduct other types of diagnostic tests.

However, if the motor 36 is not generating back EMF, then execution of this method continues at decisional block 50. Decisional block 50 determines whether or not a flyback voltage is being induced by the inductance of motor 36. If there is a flyback voltage, as indicated by block 51, the motor rotor is locked. If there is no flyback voltage, as indicated by block 52, the system has either an open-circuit or a short-circuit.

While detection of the reverse voltage, or flyback, might appear to be an elementary problem, considerations arise in practical systems which limit the methods which can be used. The present invention overcomes these limitations while using simple, inexpensive circuitry which is compatible with and easily incorporated into typical motor control electronics.

A practical limitation in the exemplary embodiment of the present invention, as seen in FIG. 4a, is that the motor terminal voltage is rectified in order to create a feedback signal independent of the direction of motor rotation. Such rectification is desirable because it simplifies the feedback circuitry (not shown) and doubles the effective dynamic range of the control system. In the control system (not shown) of the exemplary embodiment of the present invention, knowledge of the feedback polarity is not needed.

Waveforms Associated With Certain Failure Types

FIG. 4b shows the motor terminal voltage waveform. A fixed voltage is applied to motor 36 until the drive is turned off. Upon termination of the applied voltage, the terminal voltage reverses polarity (flyback) and, finally, as the motor current reaches zero, all that remains is the back EMF, Eb.

FIG. 4c shows the rectified motor terminal voltage in the exemplary embodiment of the present invention. It is similar to the waveform in FIG. 4b except the output of the rectifier provides the flyback voltage with the same polarity as that of the drive voltage. It is clear in FIG. 4c that the flyback voltage is slightly greater than the original drive voltage by an amount designated DELTA V (DELTA V is a result of the clamping diodes and how they conduct with respect to the voltage supplies).

Figure 4E:
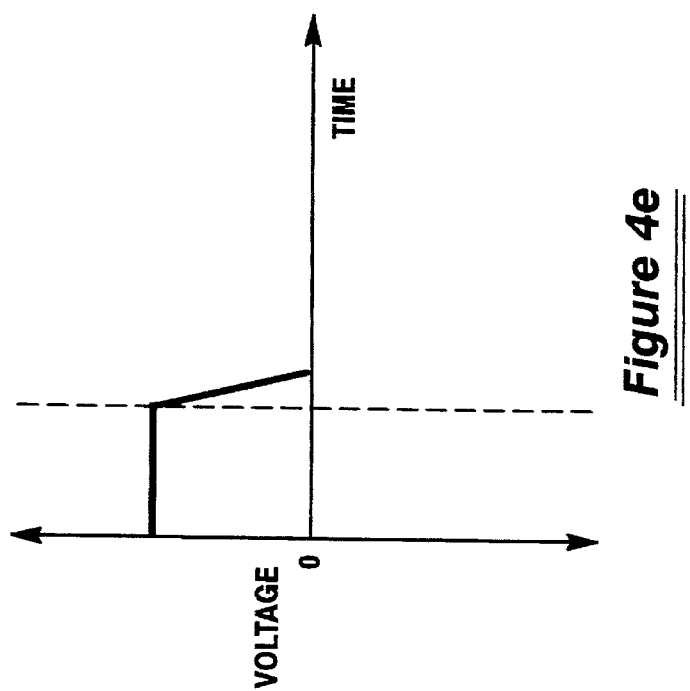
FIG. 4e shows the waveform of FIG. 4d without the flyback pulse, as is the case when no motor is present in the circuit path.
Figure 4D:
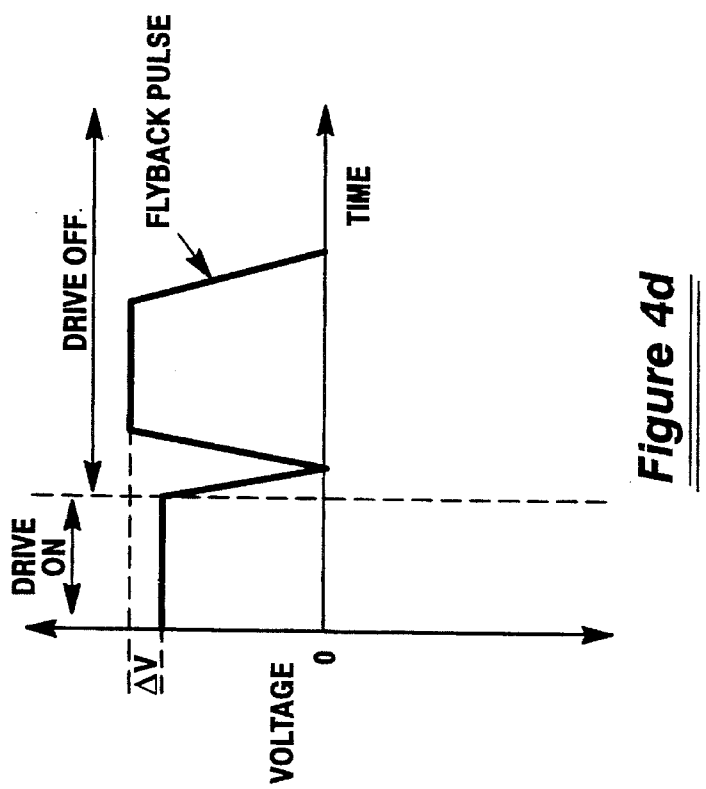
FIG. 4d shows the waveform of FIG. 4c without the back EMF, as is the case when a locked rotor condition exists.

FIG. 4d shows the rectified motor terminal voltage waveform when there is no back EMF, and FIG. 4e shows this waveform when there is no flyback voltage. It is these two waveforms which have particular significance in detecting and recognizing a circuit failure and its type. FIG. 4d indicates that a motor is in the system because the flyback voltage exists, yet, because there is no back EMF, the motor is not moving (i.e., locked rotor condition). FIG. 4e indicates that, because there is no flyback voltage, the motor is not in the circuit (i.e., short-circuit or open-circuit condition).

It should also be noted that the exemplary embodiment of the present invention uses optical coupling (not shown) of the pulse-width modulated (PWM) drive signals to the motor driver transistors (represented as switches 32a, 32b, 34a and 34b). Optical coupling is used to reduce, if not eliminate, the introduction of motor noise into the control circuitry. However, optocouplers tend to have long turnoff times and thus introduce a delay between pulse termination at the controller and the actual cessation of motor drive. The variability of this delay makes it difficult to determine the time at which to sample the motor terminal voltage.

Keeping the practical concerns of rectification and optocoupling in mind, there remain two characteristics of the flyback voltage which are not affected by the above conditions. As seen in FIGS. 4b, 4c and 4d, the first unaffected characteristic is that there is a momentary loss of voltage from the rectifier output as the motor terminal voltage passes through zero. Thus, one way of detecting the flyback pulse is to detect the momentary interruption in the rectified voltage.

The second unaffected characteristic is the fact that the motor terminal voltage is greater in magnitude during the flyback pulse than it is under drive. This condition is seen in both FIGS. 4b, 4c and 4d, although better illustrated in FIGS. 4c and 4d because of the side-by-side positioning of the two portions of the rectified motor terminal voltage waveform. As mentioned, the voltage difference is designated DELTA V. During flyback, the voltage is greater than the supply voltage by an amount equal to the two diode forward drops; when driven, the voltage is lower by two transistor collector to emitter drops. The difference, DELTA V, is typically two or three volts. However, since this Small difference is superimposed on the bus voltage, which may be 50 to 100 volts or more, detection of the change, although possible, would require high resolution sensing circuitry.

As mentioned, for the exemplary embodiment of the present invention, it is the momentary loss of rectified voltage which is used to detect the flyback pulse and not the difference in voltage between the drive pulse and the flyback pulse. It should be noted that although the exemplary embodiment of the present invention rectifies the terminal voltage before threshold detection as part of the flyback detection circuit, this is not necessary. If the terminal voltage was not rectified, as is understood by those skilled in the art, comparable means for detecting the negative flyback voltage (see FIG. 4b) can be developed (e.g., a negative threshold detector or a zero-crossing detector).

Circuit for Determining If A Flyback And Back EMF Exist

Figure 5A:
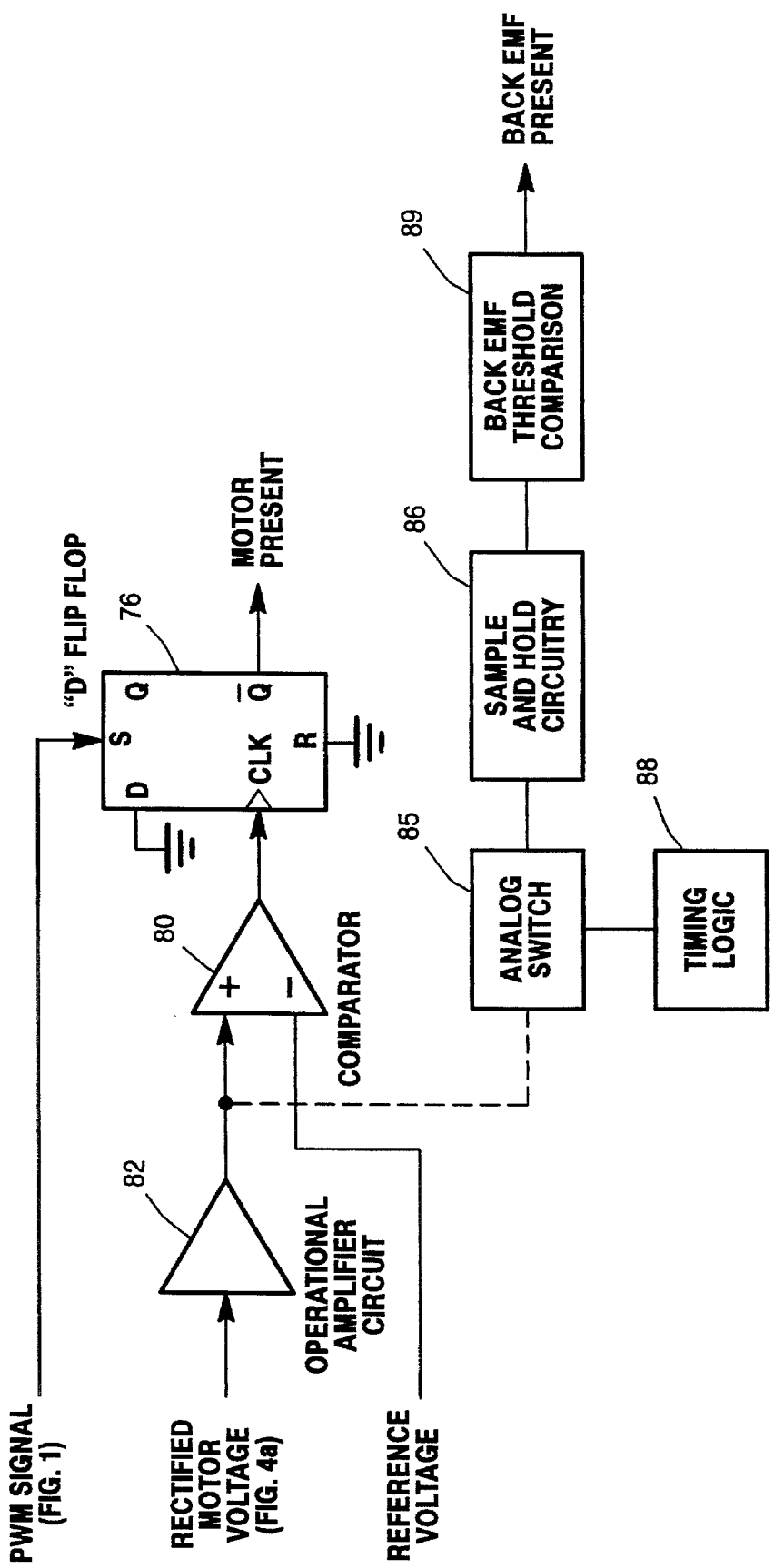
FIG. 5a shows the circuitry for detecting the flyback voltage created by the motor in FIG. 1 and shown in FIGS. 4c and 4d, and it also shows the high-level functional blocks for detection and measurement of back EMF.

FIG. 5a shows a circuit which incorporates an aspect of the present invention. It should be noted that the circuit design for the exemplary embodiment of the present invention is for use with a motor power bus of 60 volts (±30 volts with respect to ground); however, it is understood by those skilled in the art that the system and method of the present invention can be used with any voltage level given the appropriate component value adjustments.

In FIG. 5a, signal PWM (as seen in FIG. 1) is applied the S-input (SET) of D flip-flop 76. The Q-NOT output of the D flip-flop 76 represents a signal indicating whether or not a motor is present. The D-input and R-input (RESET) to D flip-flop 76 are connected to pull-down circuits represented by the ground symbol. The CLK input of the flip-flop 76 is supplied by a comparator circuit 80. The comparator circuit receives its positive input from operational amplifier circuit 82 and its negative input from a fixed reference voltage.

In operation, operational amplifier circuit 82 performs a voltage translation and amplitude adjustment on the output of the motor voltage rectifier circuit of FIG. 4a. The output of the operational amplifier circuit 82 swings from approximately −3 volts to +3 volts as the motor voltage goes from zero to either +60 volts of −60 volts; the total swing of 6 volts is compatible with the input voltage range of an analog-to-digital converter (not shown) used for feedback control of the motor velocity. The waveforms that appear at the output of operational amplifier circuit 82 are scaled representations of the waveforms shown in FIGS. 4c through 4e, and, therefore, contain the information necessary for detecting the presence of flyback and back EMF.

Figure 5B:
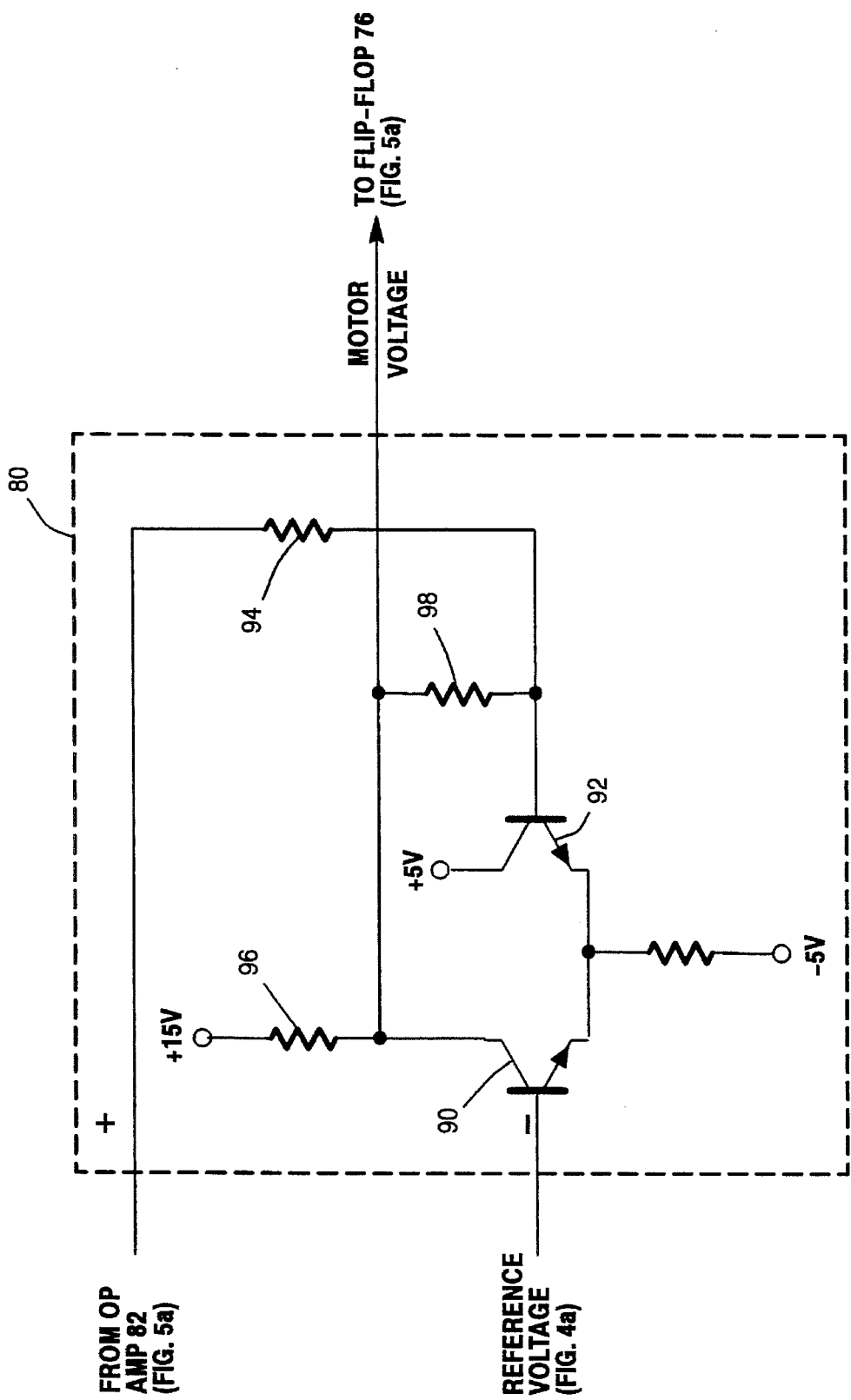

For practical purposes, it is desirable that the output of the flyback detection circuit be a digital signal which reflects the presence and proper amplitude of the flyback pulse. Comparator circuit 80 is used to convert the scaled motor terminal voltage from an analog signal to the desired digital As seen in FIG. 5b, the comparator circuit 80 used in the exemplary embodiment comprises transistors 90 and 92, in conjunction with resistors 94 through 96. The output of operational amplifier circuit 82 is applied to the base of transistor 92 and the reference voltage is applied to the base of transistor 90. A small amount of hysteresis is provided by positive feedback from the collector of transistor 90 to the base of transistor 92 via resistors 98 and 94; this feedback prevents noise from triggering multiple threshold crossings.

It should be understood that any of a number of well known comparator circuits could be used, provided that equivalent gain, bandwidth, and hysteresis characteristics are present.

In the exemplary embodiment of the present invention, the reference voltage is set to approximately +0.3 volts. With zero motor voltage, transistor 90 conducts and transistor 92 does not; the digital output at the collector of transistor 90 is in the low or zero state. When the motor voltage reaches approximately 35 volts, the voltage at the base of transistor 92 exceeds the voltage at the base of transistor 90. At this point, transistor 92 then conducts and transistor 90 is switched to the "off" state. The voltage at the collector of transistor 90 then rises to its high level. The level is slightly less than the 15 volt supply (due to the divider effect produced by the feedback network) but is well above the minimum value needed to guarantee a logical "1" signal to the subsequent CMOS logic (typically one-half of the CMOS logic supply voltage).

The output of comparator 80 goes high when voltage is applied to the motor provided that the voltage exceeds the 35 volt threshold. The 35 volt threshold assures that a short from either motor lead to frame ground will be detected, since the voltage under these circumstance would be half the bus voltage or 30 volts. When the pulse is terminated and the momentary interruption of the rectified motor voltage occurs, as shown in FIG. 4c and 4d, the level drops to approximately 30 volts before the hysteresis of the comparator is overcome and its output switches to the "low" state. The proper comparator output is thus present only if (a) the rectified motor voltage exceeds approximately 35 volts while drive is present, (b) falls below 30 volts when drive is interrupted, and (c) again exceeds 35 volts during the flyback interval when the stored energy in the motor magnetic field is being dissipated.

Continuing with FIG. 5a, the PWM drive signal is applied to the S-input (SET) of flip-flop 76. It should be noted that flip-flop 76 output state is determined by the state of its D-input at the time of a low-to-high clock (CLK) transition, if and only if the S-input is low. However, if the S-input is high, which means the motor is being driven, the Q-NOT output of flip-flop 76 is forced into the low state regardless of the D-input state during a low-to-high transition of the clock. But, when the motor is not being driven, the S-input is low; thus, a low-to-high transition of the clock input allows the value of the D-input to determine the flip-flop 76 output state. Since the D-input is always low, the Q-NOT output assumes its high state.

When the PWM signal goes high, the S-input goes high and, as described, forces the Q-NOT output low. The MOTOR PRESENT signal is thus low. After a brief delay period caused by semiconductor response times, the rectified and scaled motor terminal voltage appears but the resulting clock transition does not produce a state change because the SET input is already high and overrides the clock input.

When the PWM drive signal goes low, the S-input goes low. Because of the inductive nature of the motor as described above, the motor voltage follows one of the waveforms shown in FIGS. 4c through 4e. Assuming the generated waveform looks like that in FIG. 4c, the notch in the rectified waveform, which exists as the motor voltage passes through zero, is converted to digital form and applied to the clock input of the flip-flop 76. A low-to-high transition of the clock occurs as the flyback voltage crosses the 35 volt threshold. Because the S-input is low, this transition in the presence of the low D-input causes the Q-NOT output and, hence, the MOTOR PRESENT signal to go high. The high state of MOTOR PRESENT only occurs if a flyback pulse occurs (creating the necessary low-to-high transition of the CLK during a no-drive state); therefore, this is a valid means for verifying the presence of a motor in the circuit.

Figure 3A:
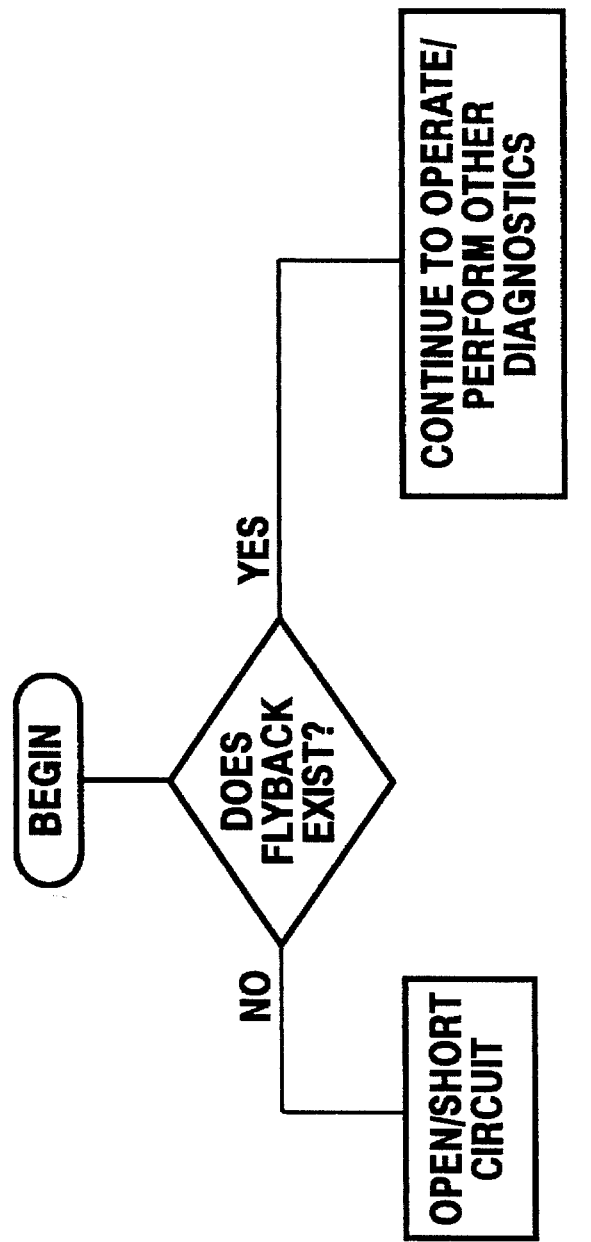
FIG. 3a shows a high-level flowchart of an alternative method used for qualifying the problem conditions in a motor system, although not all of the problem conditions of FIG. 3 are shown therein.

In the exemplary embodiment of the present invention, when the motor is not required to be in the active state, a low duty cycle drive signal is applied by the controller. This low duty cycle signal is enough to activate the detection circuitry but not enough to cause motor rotation. Because the low duty cycle signal is not enough to cause motor rotation, in this configuration, no back EMF will exist. Thus, because the low duty cycle drive signal can only be used to detect flyback, its purposes is to check for open-circuit or short-circuit conditions such as is shown in FIG. 3a. In the exemplary embodiment of the present invention, when the motor is not required to be in the active state, the pulse rate is approximately 500 hertz and the duty cycle approximately 5 percent.

Also shown in FIG. 5a, is a high-level representation of how the back EMF is detected. Analog switch 85 receives its input from the output of operational amplifier circuit 82. Switch 85, in turn, is coupled to sample and hold circuitry 86 which provides the measured level of back EMF. Switch 85 is controlled by timing logic 88 such that the back EMF is not sampled by the sample and hold circuitry 86 until a sufficient amount of time has elapsed for decay of the motor current after the PWM drive signal is inhibited. The timing logic 88 then turns switch 85 on and allows the sample and hold circuitry to measure the back EMF. The timing logic is also responsible for inhibiting the drive during this sampling period. Finally, the BACK EMF THRESHOLD COMPARISON circuitry 89 receives the sampled back EMF, compares it to a threshold value and produces the signal BACK EMF PRESENT as seen in FIG. 5a. It should be noted that it is well known by those skilled in the art how to take a sampled analog signal, compare it to a threshold value and generate a digital signal indicating whether or not it exceeded the threshold, for example, by using an op amp comparator circuit similar to element 80 in FIG. 5a. For an additional example, the analog signal could be converted by an A/D converter and the digital representation fed to custom digital circuitry or a computer which uses software to make the comparison and generate the digital signal. An example of sampling and A/D converting of the back EMF can be found in the U.S. patent application entitled "System and Method for Velocity Control of a D.C. Motor" filed Mar. 16, 1992 concurrently herewith which is herein incorporated by reference (Ser. No. 07/851,634 (Mullin et al) now abandoned.

Figure 8:
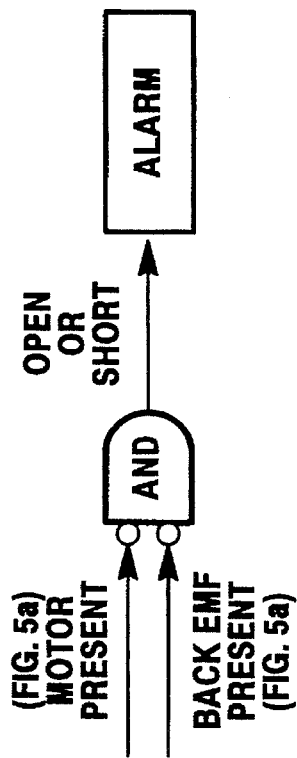
FIG. 8 is a schematic diagram of one embodiment of circuitry for indicating presence of an open circuit or short circuit condition.
Figure 7:
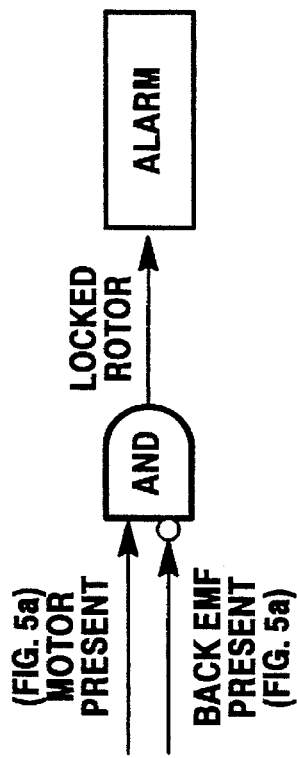
FIG. 7 is a schematic diagram of one embodiment of circuitry for indicating presence of a locked rotor condition.

Using the described means for determining whether or not back EMF exists and whether or not flyback exists, the results can be combined as shown in FIG. 3 to indicate certain types of circuit failures. For example, ANDing the MOTOR PRESENT signal (FIG. 5a, indicating flyback) and an inverted version of the BACK EMF PRESENT signal produces the necessary indication for a locked rotor condition. The design of circuitry to produce the results represented in the flowchart of FIG. 3, once the signals determining the existence of the back EMF and flyback are available, is well-understood by those skilled in the art. Additionally, these results can be indicated to the user of the detection system in a variety of ways including flashing lights on circuit boards, alarms, computer screens, etc. FIG. 7 illustrates an example of circuitry for generating an alarm for a locked rotor condition. FIG. 8 illustrates an example of circuitry for generating an alarm for an open circuit or short circuit condition.

It should be noted that the flowchart of FIG. 3 in no way implies a time sequence for obtaining the flyback and back EMF signals. The chronological sequence of the events producing these signals is evident from inspection of FIGS. 4b through 4d. Both the flyback and back EMF signals are assumed to have been acquired prior to the logical operations implied in FIG. 3.

Alternate Embodiment

Although the exemplary embodiment of the present invention has been described using a PWM drive system, it should be understood by those skilled in the art that this invention can be readily adapted to a linear driven system.

Figure 6:
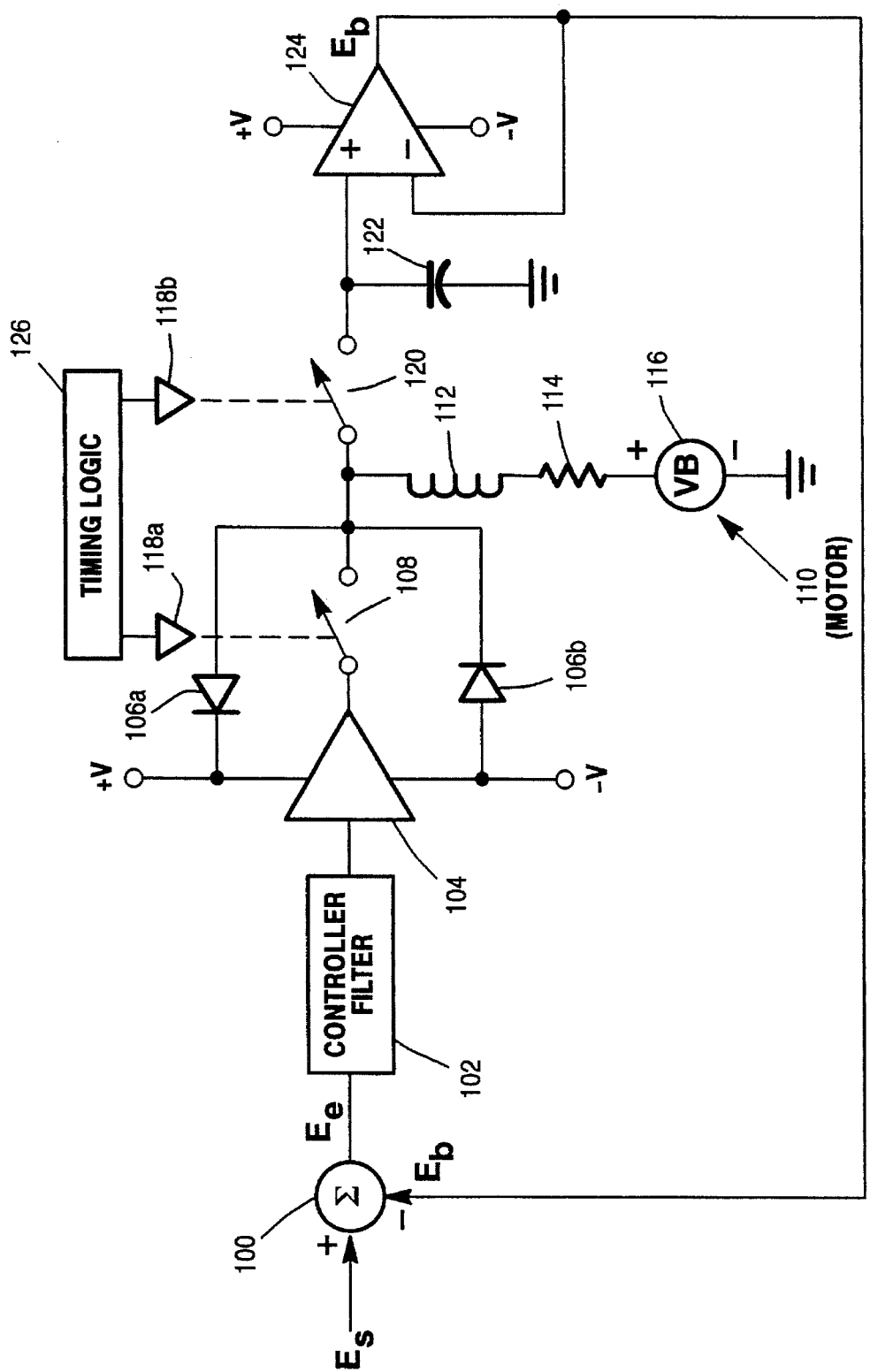
FIG. 6 is a high-level functional block diagram of a linear driven system designed to sample back EMF.

FIG. 6 shows a set point voltage, Es, applied to the positive input of a summing junction 100. The negative input of summing junction 100 is supplied by the sampled back EMF, Eb, and the result is an error voltage, Ee. Essentially, the summing junction 118 compares the measured back EMF, Eb, to the desired voltage, Es. The error voltage, Ee, is applied to the input of the controller/filter 102. Controller 102 serves to achieve the desired system performance. The output of the controller 102 is fed to a power amplifier 104 which also accepts the positive and negative D.C. supplies, +V and −V. The D.C. supplies are coupled to clamping diodes 106a and 106b, respectively. The output of this circuitry passes through analog switch 108, if closed, and is applied to the motor 110 represented by its circuit equivalent—a series combination of an inductance (Lm) 112, a resistor (Rm), 114, and a voltage source (VB) 116 which is the back EMF.

In operation, when the back EMF, VB, is to be sampled, the analog switch 108 is opened. After allowing sufficient time for the inductive transient caused by Lm to decay via clamping diodes 106a and 106b, the analog switch 120 is closed and the back EMF voltage across the motor 110 is then captured by the hold circuitry represented by capacitor 122 and voltage follower 124.

The sampling of the back EMF is controlled by timing logic 126. The timing logic 126 of FIG. 6 corresponds to the timing logic 88 of FIG. 5a with additional functionality. The voltage level of timing logic 126 is translated into a level necessary to control analog switches 108 and 120 by voltage translation means 118a and 118b. The voltage on capacitor 122 is buffered by the high input impedance voltage follower 124 and, as mentioned, applied to the negative input of summing junction 100 as Eb.

In adapting the circuit in FIG. 6 to incorporate the present invention, first, the voltage across the motor 110 is rectified and fed into the operational amplifier circuit 82 of FIG. 5a; second, the negated version of the signal generated by timing logic 126 of FIG. 6 which opens switch 108 (indicating drive has been interrupted) is used to replace the PWM drive signal of FIG. 5a. The new circuit of FIG. 5a created by these simple changes is now configured to detect flyback and/or back EMF for a linear driven system.

It should be noted that the present invention is particularly useful in the Small Parcel and Bundle Sorter (SPBS) system which employs carrier cell technology as described in the SPBS Executive Summary, Paramax Corp. (December 1991) which is herein incorporated by reference.

Although the invention is illustrated and described herein embodied as a circuit employing the method for determining the existence of a flyback pulse and back EMF, the invention is nevertheless not intended to be limited to the details shown. Rather, various modifications may be made in the details within the scope and range of equivalents of the claims and without departing from the spirit of the invention.

What is claimed:

1. A method for detecting a fault condition of a locked rotor condition in a D.C. motor circuit having two voltage leads comprising the steps of:
  a) applying a voltage to the D.C. motor by way of the two voltage leads, wherein the voltage is sufficient to cause motor rotation,
  b) determining if flyback exists on the two voltage leads upon interruption of the applied voltage,
  c) before, during or after said step of determining if flyback exists, determining if a back EMF exists on the two voltage leads upon interruption of the applied voltage, and
  d) indicating a locked rotor condition exists when the back EMF does not exist and the flyback does exist.

2. A method as recited in claim 1 wherein the interruption is a temporary, brief interruption of the applied voltage.

3. A method as recited in claim 1, further comprising repeating steps a), b), c) and d).

4. A method as recited in claim 1 wherein said step of determining if a back EMF exists comprises determining if a back EMF exists on the two voltage leads after interruption of the applied voltage and at least partial decay of the flyback.

5. A method as recited in claim 1, further comprising the step of indicating normal motor condition exists when the back EMF exists and the flyback exists.

6. A method as recited in claim 1 wherein:
  said step of applying a voltage comprises alternately applying and removing a voltage,
  said step of determining if flyback exists comprises determining if flyback exists upon each removal of the applied voltage, and
  said step of determining if a back EMF exists comprises determining if a back EMF exists upon each removal of the applied voltage.

7. A method as recited in claim 1 wherein the D.C. motor is a brush-commutated D.C. motor.

8. A method as recited in claim 1 wherein the applied voltage comprises a voltage waveform.

9. A method as recited in claim 1 wherein said step of determining if flyback exists comprises the steps of:
  comparing the instantaneous voltage across the motor with a predetermined reference value, and
  during interruption of the applied voltage, producing a signal indicative of whether the instantaneous voltage across the motor exceeds the predetermined reference value and thus whether flyback is present.

10. A method as recited in claim 1 wherein said step of determining if flyback exists on the two voltage leads upon interruption of the applied voltage comprises determining if instantaneous flyback exists on the two voltage leads upon interruption of the applied voltage.

11. A method as recited in claim 1 wherein said step of determining if a back EMF exists on the two voltage leads upon interruption of the applied voltage comprises determining if instantaneous back EMF exists on the two voltage leads during interruption of the applied voltage.

12. A method for detecting a fault condition of one of an open-circuit condition or short-circuit condition in a D.C. motor circuit having two voltage leads comprising the steps of:
  a) applying a voltage to the D.C. motor by way of the two voltage leads, wherein the voltage is sufficient to cause motor rotation,
  b) determining if flyback exists on the two voltage leads upon interruption of the applied voltage,
  c) before, during or after said step of determining if flyback exists, determining if a back EMF exists on the two voltage leads upon interruption of the applied voltage, and
  d) indicating one of an open-circuit or short-circuit condition exists when the back EMF does not exist and the flyback does not exist.

13. A method as recited in claim 12 wherein the interruption is a temporary, brief interruption of the applied voltage.

14. A method as recited in claim 12, further comprising repeating steps a), b), c) and d).

15. A method as recited in claim 12 wherein said step of determining if a back EMF exists comprises determining if a back EMF exists on the two voltage leads after interruption of the applied voltage and at least partial decay of the flyback.

16. A method as recited in claim 12, further comprising the step of indicating normal motor condition exists when the back EMF exists and the flyback exists.

17. A method as recited in claim 12 wherein:

said step of applying a voltage comprises alternately applying and removing a voltage, said step of determining if flyback exists comprises determining if flyback exists upon each removal of the applied voltage, and said step of determining if a back EMF exists comprises determining if a back EMF exists upon each removal of the applied voltage.

18. A method as recited in claim 12 wherein the D.C. motor is a brush-commutated D.C. motor.

19. A method as recited in claim 12 wherein the applied voltage comprises a voltage waveform.

20. A method as recited in claim 12 wherein said step of determining if flyback exists comprises the steps of:

comparing the instantaneous voltage across the motor with a predetermined reference value, and during interruption of the applied voltage, producing a signal indicative of whether the instantaneous voltage across the motor exceeds the predetermined reference value and thus whether flyback is present.

21. A method as recited in claim 12 wherein said step of determining if flyback exists on the two voltage leads upon interruption of the applied voltage comprises determining if instantaneous flyback exists on the two voltage leads upon interruption of the applied voltage.

22. A method as recited in claim 12 wherein said step of determining if a back EMF exists on the two voltage leads upon interruption of the applied voltage comprises determining if instantaneous back EMF exists on the two voltage leads during interruption of the applied voltage.

23. A system for detecting a fault condition of a locked rotor condition in a D.C. motor circuit having two voltage leads comprising:

a) means for applying a voltage to the D.C. motor by way of the two voltage leads, wherein the voltage is sufficient to cause motor rotation, b) means for determining if flyback exists on the two voltage leads upon interruption of the applied voltage, c) means for determining if a back EMF exists on the two voltage leads upon interruption of the applied voltage, and d) means, responsive to said means for determining if flyback exists and to said means for determining if a back EMF exists, for indicating a locked rotor condition exists when the back EMF does not exist and the flyback does exist.

24. A system as recited in claim 23 wherein said means for determining if a back EMF exists comprises means for determining if a back EMF exists on the two voltage leads after interruption of the applied voltage and at least partial decay of the flyback.

25. A system as recited in claim 23 wherein said means for applying a voltage comprises means for alternately applying and removing a voltage.

26. A system as recited in claim 23 wherein the D.C. motor is a brush-commutated D.C. motor.

27. A system as recited in claim 23 wherein the applied voltage comprises a voltage waveform.

28. A system as recited in claim 23 wherein said means for determining if flyback exists comprises:

means for comparing instantaneous voltage across the motor with a predetermined reference value, and means for, during interruption of the applied voltage, producing a signal indicative of whether the instantaneous voltage across the motor exceeds the predetermined reference value and thus whether flyback is present.

29. A system as recited in claim 23 wherein said means for determining if flyback exists on the two voltage leads upon interruption of the applied voltage comprises means for determining if instantaneous flyback exists on the two voltage leads upon interruption of the applied voltage.

30. A system for detecting a fault condition of one of an open-circuit or short-circuit condition in a D.C. motor circuit having two voltage leads comprising:

a) means for applying a voltage to the D.C. motor by way of the two voltage leads, wherein the voltage is sufficient to cause motor rotation, b) means for determining if flyback exists on the two voltage leads upon interruption of the applied voltage, c) means for determining if a back EMF exists on the two voltage leads upon interruption of the applied voltage, and d) means, responsive to said means for determining if flyback exists and to said means for determining if a back EMF exists, for indicating one of an open-circuit or short-circuit condition exists when the back EMF does not exist and the flyback does not exist.

31. A system as recited in claim 30 wherein said means for determining if a back EMF exists comprises means for determining if a back EMF exists on the two voltage leads after interruption of the applied voltage and at least partial decay of the flyback.

32. A system as recited in claim 30 wherein said means for applying a voltage comprises means for alternately applying and removing a voltage.

33. A system as recited in claim 30 wherein the D.C. motor is a brush-commutated D.C. motor.

34. A system as recited in claim 30 wherein the applied voltage comprises a voltage waveform.

35. A system as recited in claim 30 wherein said means for determining if flyback exists comprises:

means for comparing instantaneous voltage across the motor with a predetermined reference value, and means for, during interruption of the applied voltage, producing a signal indicative of whether the instantaneous voltage across the motor exceeds the predetermined reference value and thus whether flyback is present.

36. A system as recited in claim 30 wherein said means for determining if flyback exists on the two voltage leads upon interruption of the applied voltage comprises means for determining if instantaneous flyback exists on the two voltage leads upon interruption of the applied voltage.

37. A method for detecting a fault condition in a D.C. motor circuit having two electrical input leads, the method comprising the steps of:

a) applying an electrical input to the D.C. motor by way of the two electrical input leads, wherein the electrical input is sufficient to cause motor rotation, b) determining if flyback exists on the two electrical input leads upon interruption of the applied electrical input, c) before, during or after said step of determining if flyback exists, determining if a back EMF exists on the two electrical input leads upon interruption of the applied electrical input, and d) indicating a locked rotor condition exists when the back EMF does not exist and the flyback does exist.

38. A method as recited in claim 37, further comprising the step of:

indicating presence of an open-circuit or short-circuit condition when the back EMF does not exist and the flyback does not exist.

39. A method as recited in claim 37 wherein the interruption is a temporary, brief interruption of the applied electrical input.

40. A method as recited in claim 37, further comprising repeating steps a), b), c) and d).

41. A method as recked in claim 37 wherein said step of determining if a back EMF exists comprises determining if a back EMF exists on the two electrical input leads after interruption of the applied electrical input and at least partial decay of the flyback.

42. A method as recited in claim 37, further comprising the step of indicating normal motor condition exists when the back EMF exists and the flyback exists.

43. A method as recited in claim 37 wherein:

said step of applying an electrical input comprises alternately applying and removing a voltage, said step of determining if flyback exists comprises determining if flyback exists upon each removal of the applied voltage, and said step of determining if a back EMF exists comprises determining if a back EMF exists upon each removal of the applied voltage.

44. A method as recited in claim 37 wherein the D.C. motor is a brush-commutated D.C. motor.

45. A method as recited in claim 37 wherein the applied electrical input comprises a voltage waveform.

46. A method as recited in claim 37 wherein said step of determining if flyback exists comprises the steps of:

comparing the instantaneous electrical output from the motor on the two electrical input leads with a predetermined reference value, and during interruption of the applied electrical input, producing a signal indicative of whether the instantaneous electrical output from the motor on the two electrical input leads exceeds the predetermined reference value and thus whether flyback is present.

47. A method as recited in claim 37 wherein said step of determining if flyback exists on the two electrical input leads upon interruption of the applied electrical input comprises determining if instantaneous flyback exists on the two electrical input leads upon interruption of the applied electrical input.

48. A method as recited in claim 37 wherein said step of determining if a back EMF exists on the two electrical input leads upon interruption of the applied electrical input comprises determining if instantaneous back EMF exists on the two electrical input leads during interruption of the applied electrical input.

49. A system for detecting a fault condition in a D.C. motor circuit having two electrical input leads comprising:

a) means for applying an electrical input to the D.C. motor by way of the two electrical input leads, wherein the electrical input is sufficient to cause motor rotation, b) means for determining if flyback exists on the two electrical input leads upon interruption of the applied electrical input, c) means for determining if a back EMF exists on the two electrical input leads upon interruption of the applied electrical input, and d) means, responsive to said means for determining if flyback exists and to said means for determining if a back EMF exists, for indicating a locked rotor condition exists when the back EMF does not exist and the flyback does exist.

50. A system as recited in claim 49, further comprising:

means for indicating existence of an open-circuit or short-circuit condition when the back EMF does not exist rand the flyback does not exist.

51. A system as recited in claim 49 wherein said means for determining if a back EMF exists comprises means for determining if a back EMF exists on the two electrical input leads after interruption of the applied electrical input and at least partial decay of the flyback.

52. A system as recited in claim 49 wherein said means for applying a electrical input comprises means for alternately applying and removing a voltage.

53. A system as recited in claim 49 wherein the D.C. motor is a brush-commutated D.C. motor.

54. A system as recited in claim 49 wherein the applied electrical input comprises a voltage waveform.

55. A system as recited in claim 49 wherein said means for determining if flyback exists comprises:

means for comparing instantaneous electrical output from the motor on the two electrical input leads with a predetermined reference value, and means for, during interruption of the applied electrical input, producing a signal indicative of whether the instantaneous electrical output from the motor on the two electrical input leads exceeds the predetermined reference value and thus whether flyback is present.

56. A system as recited in claim 49 wherein said means for determining if flyback exists on the two electrical leads upon interruption of the applied electrical input comprises means for determining if instantaneous flyback exists on the two electrical input leads upon interruption of the applied electrical input.

* * * * *